US012669379B2

(12) United States Patent
Rifai

(10) Patent No.: US 12,669,379 B2
(45) Date of Patent: Jun. 30, 2026

(54) DELAY-FREE TEMPERATURE MEASUREMENT OF POWER SWITCHES

(71) Applicant: Vitesco Technologies GmbH, Regensburg (DE)

(72) Inventor: Fadi Rifai, Munich (DE)

(73) Assignee: SCHAEFFLER TECHNOLOGIES AG & CO. KG, Herzogenaurach (DE)

( * ) Notice: Subject to any disclaimer, the term of this patent is extended or adjusted under 35 U.S.C. 154(b) by 301 days.

(21) Appl. No.: 18/613,764

(22) Filed: Mar. 22, 2024

(65) Prior Publication Data

US 2024/0319012 A1 Sep. 26, 2024

(30) Foreign Application Priority Data

Mar. 24, 2023 (DE) ...................... 10 2023 202 701.1

(51) Int. Cl.
*G01J 5/00* (2022.01)
*G01J 5/04* (2006.01)
(Continued)

(52) U.S. Cl.
CPC ............. *G01J 5/0096* (2013.01); *G01J 5/048* (2013.01); *H10W 70/40* (2026.01); *H10W 72/652* (2026.01); *H10W 90/767* (2026.01)

(58) Field of Classification Search
CPC .. G01J 5/0096; G01J 5/048; G01J 5/00; G01J 5/04; H10W 70/40; H10W 72/652; H10W 90/767; H10W 72/60; H10W 90/00
See application file for complete search history.

(56) References Cited

U.S. PATENT DOCUMENTS 4,950,900 A * 8/1990 Takeuchi .................. G01J 5/34
250/338.3
6,046,470 A 4/2000 Williams et al.
(Continued)

FOREIGN PATENT DOCUMENTS

CN 1665036 A * 9/2005 .......... H10W 70/465
CN 104062014 A * 9/2014 ................ G01J 5/80
(Continued)

OTHER PUBLICATIONS

Search Report dated Feb. 6, 2024, by the German Patent Office for Application No. 10 2023 202 701.1, with machine translation. (12 pages).

*Primary Examiner* — Laura Martin
*Assistant Examiner* — Julia Fitzpatrick
(74) *Attorney, Agent, or Firm* — Buchanan Ingersoll & Rooney PC

(57) ABSTRACT

A temperature measurement and a method for measuring the temperature of a semiconductor substrate, or semiconductor substrate, of a power switch assembly, which is delay free. The power switch assembly includes a circuit and a printed circuit board (PCB), where the circuit is mounted to the PCB. A lead frame is part of the circuit, at least one semiconductor substrate is part of the circuit and mounted to the lead frame, and a sensor is part of the circuit and mounted to the lead frame. A chamber is located between the sensor and the semiconductor substrate, such that the chamber galvanically isolates the sensor from the semiconductor substrate. The sensor detects the temperature of the semiconductor substrate.

15 Claims, 1 Drawing Sheet

(51) Int. Cl.
  *H10W 70/40*        (2026.01)
  *H10W 72/60*        (2026.01)
  *H10W 90/00*        (2026.01)

(56)              References Cited

U.S. PATENT DOCUMENTS

2008/0170600 A1 *   7/2008  Sattler ..................... G01K 1/16
                                                 374/E7.018
2010/0012645 A1 *   1/2010  Baier .................... G01K 13/00
                                                 219/413
2017/0309539 A1    10/2017  Weißmann et al.

FOREIGN PATENT DOCUMENTS

| | | | | | |
|---|---|---|---|---|---|
| DE |     10234585 | A1 | * | 3/2004 | .......... H10W 70/429 |
| DE | 102013212925 | A1 |   | 1/2015 | |
| DE | 102022205218 | A1 |   | 11/2023 | |
| EP |      2113768 | A1 | * | 11/2009 | ............ G01N 30/30 |
| EP |      4155742 | A1 |   | 3/2023 | |
| KR |  20120004699 | U | * | 6/2012 | ............ G01J 1/0219 |
| KR |  20140071596 | A | * | 6/2014 | ............ H10W 70/40 |
| KR |  20180130459 | A | * | 12/2018 | ................ G01J 5/00 |

\* cited by examiner

DELAY-FREE TEMPERATURE MEASUREMENT OF POWER SWITCHES

CROSS REFERENCE TO RELATED APPLICATIONS

This application claims priority to German Patent Application No. 10 2023 202 701.1, filed Mar. 24, 2023, the contents of such application being incorporated by reference herein.

FIELD OF THE INVENTION

The invention relates generally to a temperature measurement and a method for measuring the temperature of a semiconductor substrate of a power switch, which is delay free.

BACKGROUND OF THE INVENTION

Power switches which include circuitry, such as a metal-oxide-semiconductor field-effect transistor (MOSFET), or insulated gate bipolar transistors (IGBT), are commonly known and are used in various applications. A MOSFET or IGBT include the use of an electric field to control the flow of current in a semiconductor.

These devices typically generate heat. It is desirable to know the temperature of the semiconductor substrate of the circuitry used in the power switch to prevent thermal destruction of the power switch.

One common way the temperature of the semiconductor substrate is determined is through the use of a Negative Temperature Coefficient (NTC) sensor, which is placed in close proximity to the power switch and provides an indirect temperature measurement. The NTC sensor records the temperature with a time delay because the thermal capacities of the printed circuit board (PCB), the transistor housing, and the NTC sensor are all different, and this results in a delay of the transmission of the temperature. Depending on the implementation of the NTC sensor, this time delay may lead to a protective shutdown of the power switch that may be too late or too early, which results in either premature aging or destruction of the power switch. In some implementations of a power switch, the entire range of operation of the power switch is avoided to prevent thermal destruction of the power switch. This limited use of the power switch also results in a limited power output.

Another common way to determine the temperature is through the use of measuring the voltage drop across and the current flow through the power switch to derive the temperature of the semiconductor substrate from the bulk resistance curve of the switch. This approach of determining the temperature is more complex with regard to hardware and requires galvanic isolation on the switch at higher voltages. This approach also has limitations with regard to accuracy, as the bulk resistance curve may vary due to manufacturing tolerances and operating temperature of the power switch. The temperature may only be measured when current is flowing, and the additional components used in this approach increase the failure rate of the hardware, making Automotive Safety Integrity Level (ASIL) requirements more difficult to meet.

SUMMARY OF THE INVENTION

There exists a need for accurate detection of the temperature of a power switch which has circuitry such as a MOSFET or IGBT, such that the entire operating range of the power switch is able to be utilized, and premature shut down or thermal destruction is avoided.

Therefore, an aspect of the invention is to provide temperature detection of a power switch which is accurate and delay-free, or lag-free, facilitating use of the entire operating range of the power switch, and avoiding thermal destruction or protective shut down.

In an embodiment, the present invention is a power switch having an integrated sensor which detects the temperature of the power switch, or more specifically the temperature of the semiconductor substrate which is delay free.

In an embodiment, the present invention includes a temperature measurement of the galvanically isolated semiconductor substrate of the switch without delay and without additional hardware, whereby the number of additional components and the failure rate is minimized. In addition, it is possible to detect the temperature without current flow through the power switch.

In an embodiment, the temperature measurement is achieved by incorporating an infrared sensor (e.g., infrared receiver diode or transistor) into the switch in such a way that the infrared radiation from the silicon may be detected by the sensor. The outputs of the infrared sensor are brought out of the circuit breaker and connected to a measuring device, which is read and evaluated by the controlling microprocessor, for example.

The power switch having the integrated infrared sensor enables an instantaneous and galvanically isolated temperature measurement, so that the power switch is better protected and utilized. In addition, the high costs of measuring the voltage drop across and the current flow through the power switch are eliminated without increasing the overall failure rate of the circuit.

Therefore, according to a first aspect, the invention is a power switch assembly having a circuit and a printed circuit board (PCB), where the circuit is mounted to the PCB. A lead frame is part of the circuit, at least one semiconductor substrate is part of the circuit and mounted to the lead frame, and a sensor is part of the circuit and mounted to the lead frame. A chamber is located between the sensor and the semiconductor substrate, such that the chamber galvanically isolates the sensor from the semiconductor substrate. The sensor detects the temperature of the semiconductor substrate.

In an embodiment, the sensor is an infrared sensor.

In an embodiment, the circuit is one selected from the group consisting of a MOSFET, IGBT, and TRIAC.

In an embodiment, a housing is mounted to the PCB on the opposite side of the PCB relative to the circuit. The housing transfers heat away from the PCB and the circuit.

In an embodiment, the power switch assembly includes a copper layer. A portion of the copper layer is mounted to the semiconductor substrate, and another portion of the copper layer is mounted to the lead frame.

In an embodiment, the chamber is one selected from the group consisting of a cavity and a transparent plastic material.

In an embodiment, the present invention is a method directed to detecting the temperature of a circuit is disclosed. The method according to an aspect of the present invention comprises providing a lead frame, providing at least one semiconductor substrate mounted to the lead frame, providing a sensor mounted to the lead frame, and providing a chamber located between the sensor and the semiconductor substrate. In an embodiment, the method of the present invention includes galvanically isolating the sensor from the semiconductor substrate using the chamber. In an embodiment, the method of the present invention includes detecting the temperature of the semiconductor substrate using the sensor.

In an embodiment, the method of the present invention includes the sensor further comprising an infrared sensor.

In an embodiment, the method of the present invention includes the circuit being one selected from the group consisting of a MOSFET, IGBT, and TRIAC.

Further areas of applicability of aspects of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
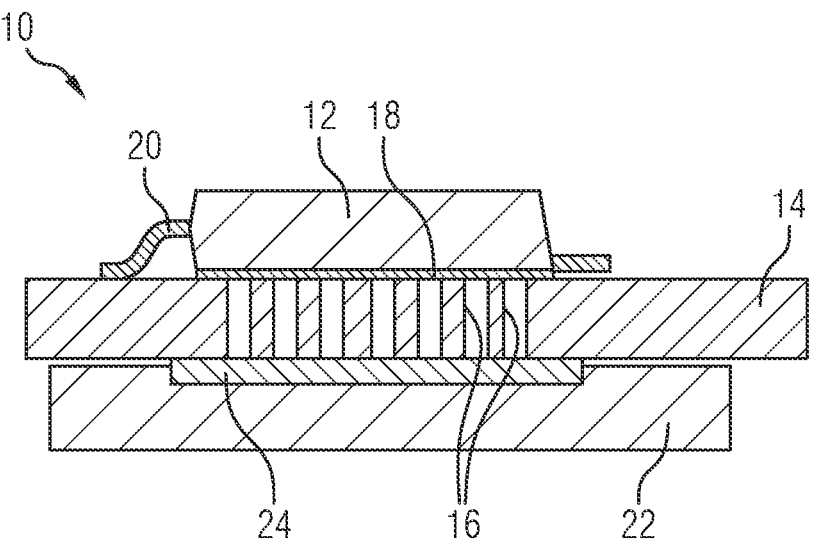
FIG. 1 is a sectional view of a power switch having an integrated sensor, according to embodiments of the present invention.

The following description of the preferred embodiment(s) is merely exemplary in nature and is in no way intended to limit the invention, its application, or uses.

Referring to the FIGS. generally, an embodiment of a power switch assembly having a circuit, such as a MOSFET circuit, with an integrated sensor according to the present invention is shown generally at 10. The power switch assembly 10 includes a MOSFET circuit 12 mounted to a printed circuit board (PCB) 14 having vias, several of which are labeled at 16. The MOSFET circuit 12 is bonded to the PCB 14 using solder paste 18, and the MOSFET circuit 12 is in electrical communication with the PCB 14 through a conductive wire 20, which is bonded to the PCB 14. The PCB 14 is mounted to a housing 22 using a thermal gap filler 24.

Figure 2:
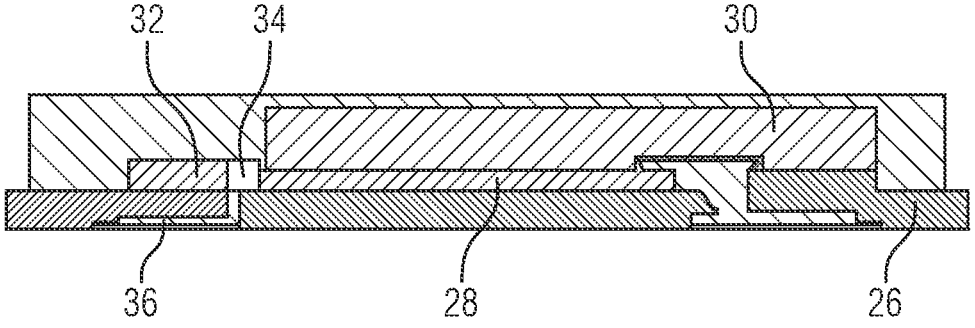
FIG. 2 is a sectional view of a circuit having an integrated sensor, according to embodiments of the present invention.

Referring now to FIG. 2, an enlarged sectional view of the MOSFET circuit 12 in FIG. 1 is shown. The MOSFET circuit 12 includes a lead frame 26 and mounted to the lead frame 26 is a semiconductor substrate, which in this embodiment is a semiconductor substrate 28. The MOSFET circuit 12 also includes a metal layer 30, which in this embodiment is a copper layer 30. The copper layer 30 is positioned such that part of the copper layer 30 is mounted to the lead frame 26, and another part of the copper layer 30 is adjacent the semiconductor substrate 28, such that the semiconductor substrate 28 is located between a portion of the copper layer 30 and a portion of the lead frame 26.

Also mounted to the lead frame 26 is a sensor, which in this embodiment is an infrared sensor 32. The infrared sensor 32 is located at a distance away from the semiconductor substrate 28, as shown in FIG. 2. Located between the sensor 32 and the semiconductor substrate 28 is a chamber, shown generally at 34. In this embodiment the chamber 34 is a vacant cavity, but it is within the scope of the invention that any material which is transparent and/or translucent, in particular transparent and/or translucent for infrared light, may be located in the cavity, such as a plastic or other appropriate materials. The chamber 34 being a vacant cavity, or having a transparent material, results in the chamber 34 and the semiconductor substrate 28 being galvanically isolated from one another. The location of the chamber 34 between the infrared sensor 32 and the semiconductor substrate 28 is such that the infrared sensor 32 is a desired distance away from the other high-voltage components of the MOSFET circuit 12, such as the lead frame 26, the semiconductor substrate 28, and the copper layer 30. The distance of the infrared sensor 32 from the lead frame 26, the semiconductor substrate 28, and the copper layer 30 is dependent upon various factors, such as, but not limited to, the operating voltage or environment of the specific application for which the MOSFET circuit 12 is used. In a non-limiting example, the infrared sensor 32 is a further distance from the high-voltage components of the MOSFET circuit 12 if the operating voltage is 1200 Volts, as opposed to 600 Volts. In another non-limiting example, the infrared sensor 32 is a further distance from the high-voltage components of the MOSFET circuit 12 if the MOSFET circuit 12 is used at a higher elevation, as opposed to a lower elevation.

In the embodiment shown, the sensor 32 is connected to the lead frame 26 by an opto-isolator or photo coupler. The infrared sensor 32 in this embodiment includes two connectors, one of the connectors 36 is shown in FIG. 2. The connectors 36 of the infrared sensor 32 are separate from any other connectors of the MOSFET circuit 12.

The power switch assembly 10 having a MOSFET circuit 12 which includes an integrated sensor is not limited to the infrared sensor 32 as described above. It is also within the scope of an aspect of the invention that any other sensor, such as a temperature sensor, or other type of sensor, which is suitable for detecting the temperature of the semiconductor substrate 28 may be used. The infrared sensor 32 is also not limited to being placed in the location shown in FIG. 2. The lead frame 26 functions as the drain of the MOSFET circuit 12, and it is within the scope of an aspect of the invention that the infrared sensor 32 may be positioned in other locations on the lead frame 26 and still detect the temperature of the semiconductor substrate 28. The MOSFET circuit 12 having an integrated sensor of an aspect of the present invention includes an infrared sensor 32 which is located a distance away from a semiconductor substrate 28, such that there is a chamber 34 which provides galvanic isolation between the infrared sensor 32 and the semiconductor substrate 28. The MOSFET circuit 12 having an integrated sensor of an aspect of the present invention provides detection of the temperature of the semiconductor substrate 28 with desired accuracy. The MOSFET circuit 12 having an integrated sensor of an aspect of the present invention operates without the influence of the thermal capacities of the PCB 14 or the housing 22, and the temperature of the semiconductor substrate 28 may be measured even when there is no current flow through the semiconductor substrate 28. The MOSFET circuit 12 having an integrated sensor of an aspect of the present invention also allows for the entire range of operation of the power switch assembly 10 to be used.

It should also be noted that aspects of the present invention are not limited to use with a MOSFET circuit 12, but may also be used with an insulated gate bipolar transistors (IGBT), Triode For Alternating Current (TRIAC), or any electronic switch.

The invention claimed is:

1. A power switch assembly, comprising:
   a circuit;

a printed circuit board, the circuit mounted to the PCB;

a lead frame being part of the circuit;

at least one semiconductor substrate being part of the circuit, and mounted to the lead frame;

a sensor being part of the circuit, and mounted to the lead frame; and a chamber located between the sensor and the at least one semiconductor substrate, such that the chamber galvanically isolates the sensor from the at least one semiconductor substrate and the lead frame;

wherein the sensor is configured for detecting the temperature of the at least one semiconductor substrate.

2. The power switch assembly according to claim 1, the sensor further comprising an infrared sensor.

3. The power switch assembly according to claim 2, wherein the circuit is one selected from the group consisting of a MOSFET, IGBT, and TRIAC.

4. The power switch assembly according to claim 2, further comprising:

a housing mounted to the PCB on the opposite side of the PCB relative to the circuit;

wherein the housing transfers heat away from the PCB and the circuit.

5. The power switch assembly according to claim 2, further comprising a copper layer, wherein a portion of the copper layer is mounted to the at least one semiconductor substrate and another portion of the copper layer is mounted to the lead frame.

6. The power switch assembly according to claim 2, the chamber being one selected from the group consisting of a cavity and a transparent plastic material.

7. The power switch assembly according to claim 1, wherein the circuit is one selected from the group consisting of a MOSFET, IGBT, and TRIAC.

8. The power switch assembly according to claim 1, further comprising:

a housing mounted to the PCB on the opposite side of the PCB relative to the circuit;

wherein the housing transfers heat away from the PCB and the circuit.

9. The power switch assembly according to claim 8, further comprising a copper layer, wherein a portion of the copper layer is mounted to the at least one semiconductor substrate and another portion of the copper layer is mounted to the lead frame.

10. The power switch assembly according to claim 8, the chamber being one selected from the group consisting of a cavity and a transparent plastic material.

11. The power switch assembly according to claim 1, further comprising a copper layer, wherein a portion of the copper layer is mounted to the at least one semiconductor substrate and another portion of the copper layer is mounted to the lead frame.

12. The power switch assembly according to claim 1, the chamber being one selected from the group consisting of a cavity and a transparent plastic material.

13. A method for detecting the temperature of a circuit, of the method comprising:

providing a lead frame;

providing at least one semiconductor substrate mounted to the lead frame;

providing a sensor mounted to the lead frame; and providing a chamber located between the sensor and the at least one semiconductor substrate;

galvanically isolating the sensor from the at least one semiconductor substrate using the chamber; and detecting the temperature of the at least one semiconductor substrate using the sensor.

14. The method according to claim 13, the sensor further comprising an infrared sensor.

15. The method of claim 13, the circuit being one selected from the group consisting of a MOSFET, IGBT, and TRIAC.

* * * * *